(12) United States Patent
Kuriyagawa et al.

(10) Patent No.: US 8,110,833 B2
(45) Date of Patent: Feb. 7, 2012

(54) DISPLAY DEVICE WITH IMPURITIES FORMED WITHIN CONNECTION REGIONS

(75) Inventors: Takeshi Kuriyagawa, Mobara (JP); Takeshi Noda, Mobara (JP); Takuo Kaitoh, Mobara (JP)

(73) Assignees: Hitachi Displays, Ltd., Chiba (JP); Panasonic Liquid Crystal Display Co., Ltd., Hyogo-ken (JP)

( * ) Notice: Subject to any disclaimer, the term of this patent is extended or adjusted under 35 U.S.C. 154(b) by 0 days.

(21) Appl. No.: 12/536,645

(22) Filed: Aug. 6, 2009

(65) Prior Publication Data
US 2010/0032681 A1 Feb. 11, 2010

(30) Foreign Application Priority Data
Aug. 7, 2008 (JP) ................................. 2008-204901

(51) Int. Cl.
*H01L 21/336* (2006.01)
*H01L 33/00* (2006.01)
(52) U.S. Cl. .............. 257/72; 257/59; 257/98; 257/100; 257/E21.414; 257/E33.053; 438/34; 438/158
(58) Field of Classification Search .............. 257/72, 257/98, 100, 102, E21.414, E33.053, 59; 438/34, 158
See application file for complete search history.

(56) References Cited

U.S. PATENT DOCUMENTS
2004/0027503 A1* 2/2004 Tanaka ............................ 349/43
* cited by examiner

*Primary Examiner* — Hung Vu
*Assistant Examiner* — Vernon P Webb
(74) *Attorney, Agent, or Firm* — Antonelli, Terry, Stout & Kraus, LLP.

(57) ABSTRACT

A display device includes: a transparent substrate; gate electrodes which are stacked on the transparent substrate; semiconductor films which are stacked above the gate electrodes and constitute thin film transistors together with the gate electrodes; source electrodes and drain electrodes which are formed above the semiconductor films; an insulation film which is stacked between the source electrodes and the semiconductor films and between the drain electrodes and the semiconductor films; and contact holes which are formed in the insulation film so as to connect the source electrodes and the drain electrodes with the semiconductor films. The semiconductor film includes a connection region which is positioned at least below the contact hole and is connected with the source electrode, and a connection region which is positioned at least below the contact hole and is connected with the drain electrode, and impurities are implanted into the connection regions.

3 Claims, 13 Drawing Sheets

DISPLAY DEVICE WITH IMPURITIES FORMED WITHIN CONNECTION REGIONS

The present application claims priority from Japanese applications JP2008-204901 filed on Aug. 7, 2008, the content of which is hereby incorporated by reference into this application.

BACKGROUND OF THE INVENTION

1. Field of the Invention

The present invention relates to a display device which performs a display control of pixels using thin film transistors (TFT), and a manufacturing method of the display device.

2. Description of the Related Art

In a display device such as a liquid crystal display device, there has been known an active-matrix-type display device which performs a display control of pixels using low-temperature poly-silicon thin film transistors (LTPS-TFT). A semiconductor film used in the thin film transistor is made of polycrystalline silicon (poly-Si) which is formed due to crystallization by annealing amorphous silicon (a-Si) using laser beams or the like, for example. The semiconductor film used in such display devices is, in general, configured such that the semiconductor film includes a channel layer in which a channel is formed in response to a voltage of a gate electrode and source/drain regions (N+ regions) which are doped with impurities and are connected with source/drain electrodes, and the LDD (Light Doped Drain) structure is formed between the channel layer and the source/drain regions. The LDD structure forms a region which is doped with impurities such that the region exhibits lower concentration than the source/drain regions. The LDD structure is provided for preventing deterioration of hot carriers of the thin film transistor and for lowering an OFF current by alleviating the concentration of an electric field in the source/drain regions.

SUMMARY OF THE INVENTION

FIG. 6A to FIG. 6H show a mode in which a drain region, a source region and an LDD region are formed in a thin film transistor having the bottom gate structure (inverse staggered structure) in which a semiconductor film S is stacked above the gate electrode GT.

As shown in these drawings, first of all, a metal layer ML and a resist pattern RS1 are formed above the stacked structure formed of the gate electrode GT and the semiconductor film S by way of insulation films GI2, GI3 (FIG. 6A and FIG. 6B). The metal layer ML is a layer provided for preventing electrostatic break down of the semiconductor film S caused by absorption of a charge from ionized impurities at the time of ion implantation, and is a metal film having conductivity which is formed by sputtering or the like. The resist pattern RS1 is formed by a known lithography step. Thereafter, ionized impurities are implanted into the semiconductor film S using the resist pattern RS1 as a mask (FIG. 6C) thus forming LDD regions LD in the semiconductor film S (FIG. 6D). Then, the resist pattern RS1 is deformed into a resist pattern RS2 by a reflow technique (FIG. 6E), and ionized impurities are again implanted into the semiconductor film S using the resist pattern RS2 as a mask (FIG. 6F) thus forming a drain region DR and a source region SR in the semiconductor film S (FIG. 6G). Next, as shown in FIG. 6H, the metal layer ML is removed and, thereafter, contact holes are formed at positions corresponding to the drain region DR and the source region SR by a lithography step, and a drain electrode DT and a source electrode ST are formed in these contact holes.

In this manner, with respect to the bottom gate structure, in forming the source/drain regions and the LDD structure, a process for forming the predetermined patterns (resist pattern RS1 and the like) using a lithography is necessary. However, the lithography step requires a large process cost, and the misalignment of patterns between lithography steps imposes limitation on designing of thin film transistors. Under such circumstances, there has been a demand for the decrease of the number of such lithography steps in the manufacture of display devices.

Accordingly, it is an object of the invention to provide a display device having the structure which can form source/drain regions and the LDD structure in the bottom gate structure in a self-aligning manner without using a pattern forming process by lithography for forming such source/drain regions and the LDD structure in the bottom gate structure, and a manufacturing method of such a display device.

To overcome the above-mentioned drawbacks, according to one aspect of the invention, there is provided a display device which includes a transparent substrate; gate electrodes which are stacked above the transparent substrate; semiconductor films which are stacked above the gate electrodes and constitute thin film transistors together with the gate electrodes; source electrodes and drain electrodes which are formed above the semiconductor films; an insulation film which is stacked between the source electrodes and the semiconductor films and between the drain electrodes and the semiconductor films; and contact holes which are formed in the insulation film so as to connect the source electrodes and the drain electrodes with the semiconductor films, wherein the semiconductor film includes a connection region which is positioned at least below the contact hole and is connected with the source electrode, and a connection region which is positioned at least below the contact hole and is connected with the drain electrode, and impurities are implanted into the connection regions. Due to such a constitution, it is possible to form the source regions and the drain regions of the thin film transistors having the bottom gate structure in a self-aligning manner.

Further, in the above-mentioned display device, the impurities may be implanted into the semiconductor film such that density of impurities in a peripheral region around the connection region is lower than density of the impurities in the connection region. Due to such a constitution, it is possible to form the LDD regions in a self-aligning manner together with the source region and the drain region of the thin film transistor having the bottom gate structure. Here, a size of the contact hole may be made smaller corresponding to the increase of a depth of the contact hole, and an amount of impurities implanted into the semiconductor film at each position of the peripheral region may be decreased corresponding to the increase of distance in the direction perpendicular to the transparent substrate from the position of the peripheral region to the contact hole. Further, the contact hole may have a tapered shape which is inclined at a predetermined angle, and the amount of impurities implanted into the semiconductor film at each position of the peripheral region may be decreased corresponding to the increase of distance from the center of the contact hole.

Further, in the above-mentioned display device, the source electrode and the drain electrode may be respectively formed of a plurality of metal films including a conductive metal thin film which is formed on a portion of the source electrode and the drain electrode, and the conductive metal thin film is in contact with the insulation film and the contact hole so as to protect the source electrode and the drain electrode.

To overcome the above-mentioned drawbacks, according to another aspect of the invention, there is provided a manufacturing method of a display device which includes the steps of: stacking gate electrodes on a transparent substrate; stacking semiconductor films each of which constitutes a thin film transistor together with the gate electrode above the gate electrodes; stacking an insulation film above the semiconductor film; forming contact holes for connecting the source electrodes and the drain electrodes with the semiconductor films in the insulation film; and implanting impurities into connection regions of the semiconductor films which are positioned at least below the contact holes and are connected with the source electrodes and the drain electrodes by way of the insulation film.

Further, in the manufacturing method of the above-mentioned display device, the impurities maybe implanted such that density of impurities in a peripheral region around the connection region is lower than density of the impurities in the connection region. Here, a size of the contact hole may be made smaller corresponding to the increase of a depth of the contact hole, and the impurities may be implanted such that an amount of impurities implanted at each position of the peripheral region is decreased corresponding to the increase of distance in the direction perpendicular to the transparent substrate from the position of the peripheral region to the contact hole. Further, the contact hole may have a tapered shape which is inclined at a predetermined angle, and the impurities may be implanted such that the amount of impurities implanted into the peripheral region is decreased corresponding to the increase of distance from the center of the contact hole.

Further, in the manufacturing method of the above-mentioned display device, the method may further include a step of forming metal thin films which constitute at least portions of the source electrodes and the drain electrodes on the insulation film in which the contact holes are formed, and the impurities may be implanted into the semiconductor film by way of both of the insulation film and the metal thin film. Due to such a constitution, the metal thin film which is used for forming the source electrodes is used as the conductive metal thin film for preventing the electrostatic break down which may occur in the impurities implantation step leading to the efficient manufacture of the thin film transistors. Here, the manufacturing method of the display device may further includes, after the above-mentioned impurities implantation step, an electrode forming step where a metal film is further formed on the metal thin film and the source electrodes and the drain electrodes are formed.

DESCRIPTION OF THE PREFERRED EMBODIMENTS

Hereinafter, an embodiment of the invention is explained in conjunction with drawings.

A display device according to one embodiment of the invention is an IPS(In-Plane Switching)-type liquid crystal display device. The liquid crystal display device includes a TFT substrate on which gate signal lines, drain signal lines, thin film transistors, pixel electrodes, and counter electrodes are arranged, a filter substrate which faces the TFT substrate in an opposed manner and forms color filters thereon, and liquid crystal material which is hermetically filled in a region sandwiched between both substrates. The TFT substrate is configured such that the thin film transistors and the like are formed on a transparent substrate formed of a glass substrate or the like.

Figure 1:
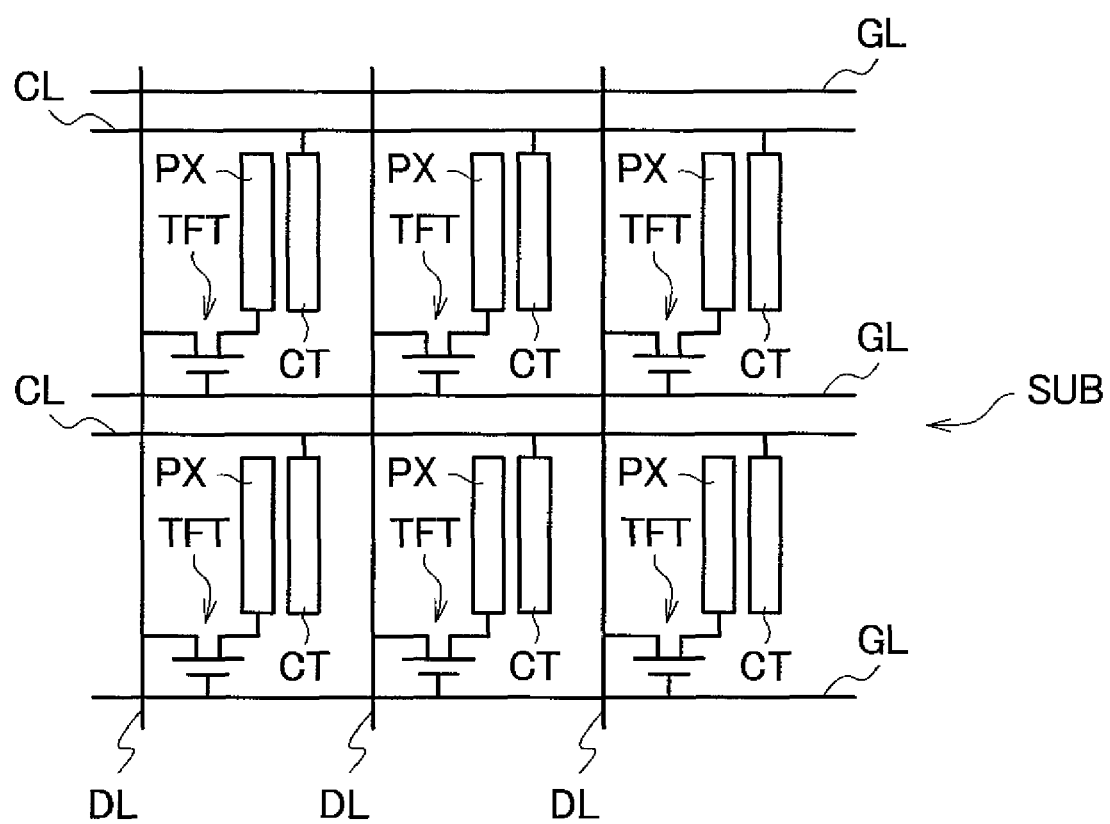
FIG. 1 is an equivalent circuit diagram of a TFT substrate which constitutes an IPS-type liquid crystal display device.
Figure 2:
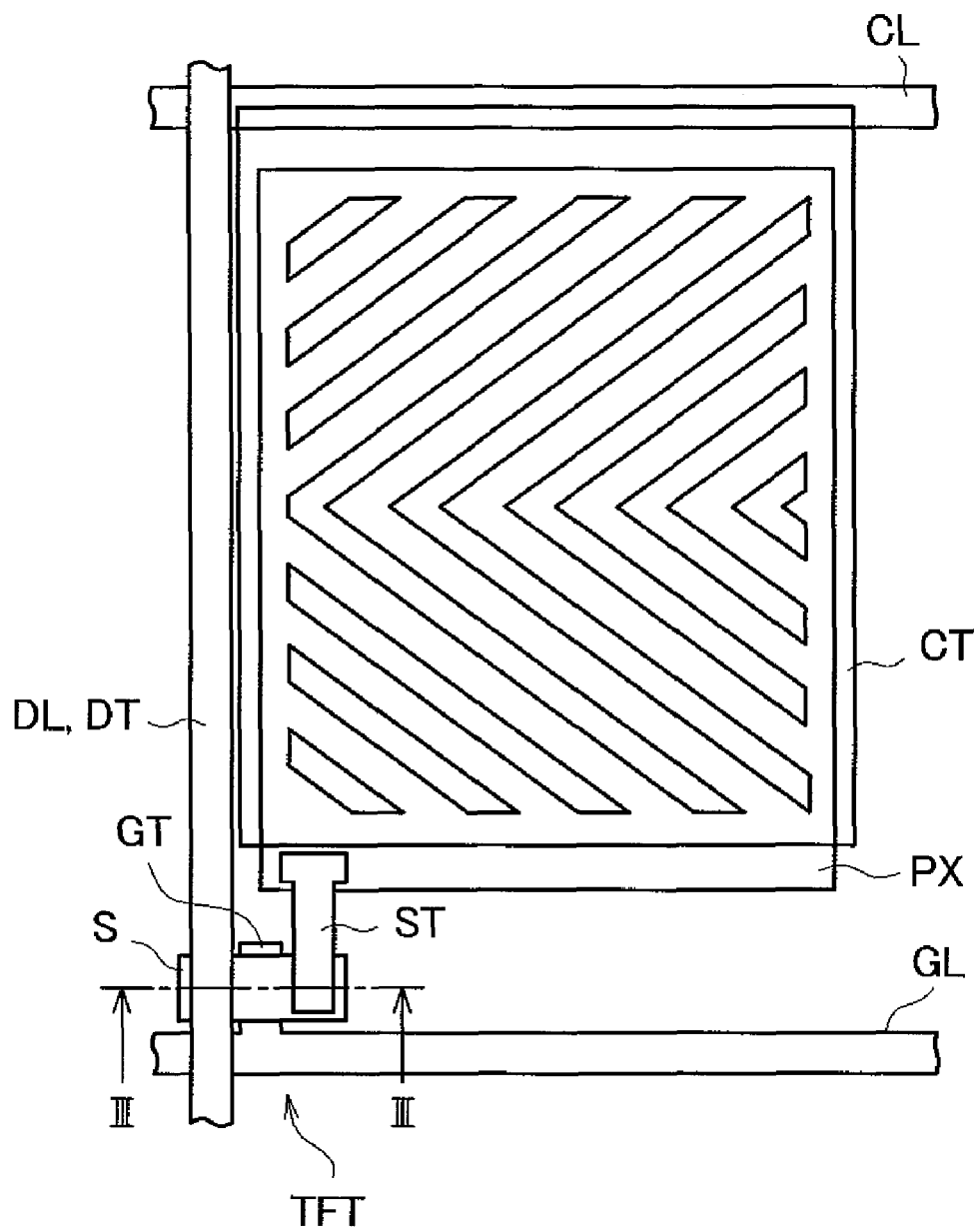
FIG. 2 is an enlarged plan view showing a pixel region of the TFT substrate according to an embodiment.

FIG. 1 is a view showing an equivalent circuit of the TFT substrate SUB of the above-mentioned liquid crystal display device. FIG. 2 is an enlarged plan view of one pixel region of the TFT substrate SUB.

In these drawings, on the TFT substrate SUB, a large number of gate signal lines GL extends in the lateral direction in the drawing at equal intervals, and a large number of drain signal lines DL extends in the longitudinal direction in the drawing at equal intervals. Respective pixels which are arranged in a matrix array are defined by the gate signal lines GL and the drain signal lines DL. Further, common signal lines CL extend in the lateral direction in the drawing parallel to the respective gate signal lines GL.

At a corner portion of the pixel region which is defined by the gate signal lines GL and the drain signal lines DL, a thin film transistor TFT having the MIS (Metal-Insulator-Semiconductor) structure is formed. A gate electrode GT of the thin film transistor TFT is connected to the gate signal line GL, and the drain signal line DL also functions as a drain electrode DT. Further, a pixel electrode PX and a counter electrode CT which form a pair are formed in each pixel region, the pixel electrode PX is connected to a source electrode ST of the thin film transistor TFT, and the counter electrode CT is connected to the common signal line CL.

In the above-mentioned circuit constitution, a reference voltage is applied to the counter electrodes CT of the respective pixels via the common signal lines CL and a gate voltage is applied to the gate signal lines GL so as to select a row of pixels. Further, at such selection timing, a video signal is supplied to the respective drain signal lines DL so that a voltage of the video signal is applied to the pixel electrodes PX of respective pixels. Due to such an operation, a lateral electric field having intensity corresponding to the video signal voltage is generated between the pixel electrode PX and the counter electrode CT, and the alignment of liquid crystal molecules is determined corresponding to the intensity of the lateral electric field.

Here, as shown in FIG. 2, the thin film transistor TFT which is arranged at a position where the gate signal line GL and the drain signal line DL intersect with each other includes a semiconductor film S. The semiconductor film S according to this embodiment is arranged above the gate electrode GT which is connected to the gate signal line GL and below the drain signal line DL (hereinafter, the drain electrode DT) and the source electrode ST which is connected to the pixel electrode PX. Further, the semiconductor film S is connected to the drain electrode DT and the source electrode ST.

In the semiconductor film S, a channel portion which becomes a path of an electric current in response to the application of a gate voltage from the gate signal line GL is formed between the drain electrode DT and the source electrode ST.

Figure 3:
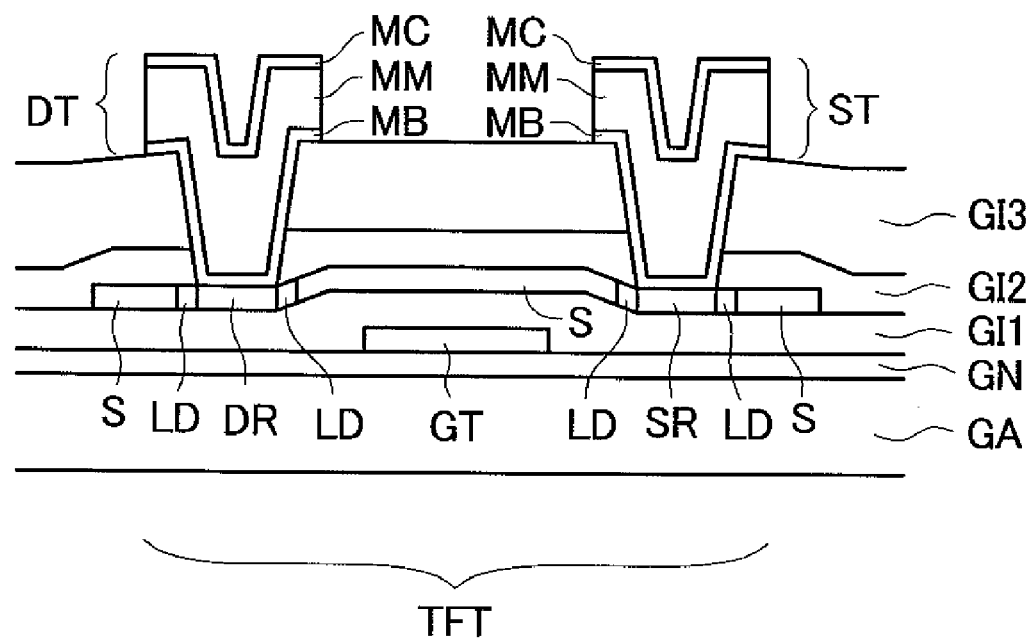
FIG. 3 is a cross-sectional view taken along a line III-III in FIG. 2.

FIG. 3 is a cross-sectional view taken along a line III-III in FIG. 2. As shown in FIG. 3, the thin film transistor TFT formed on the TFT substrate SUB is configured such that the gate electrode GT is formed on a transparent substrate GA, and the semiconductor film S, the drain electrode DT and the source electrode ST are stacked on the gate electrode GT. The gate electrode GT is formed on a contamination preventing film GN which is stacked on the transparent substrate GA, and a gate insulation film GI1 is interposed between the gate electrode GT and the semiconductor film S. Further, an insulation film GI2 and an insulation film GI3 are stacked on the semiconductor film S, and the drain electrode DT is connected to semiconductor film S via a contact hole formed in the insulation film GI2 and the insulation film GI3, and the source electrode ST is also connected to the semiconductor film S via a contact hole formed in the insulation film GI2 and the insulation film GI3.

The semiconductor film S is a film which contains a crystalline semiconductor such as polysilicon, for example. In the semiconductor film S of this embodiment, N-type impurities such as phosphorus (P) are added to regions of the semiconductor film S which are connected to the drain electrode DT and the source electrode ST respectively, and these regions form a drain region DR and a source region SR respectively. Particularly, LDD regions LD to which impurities whose amount is smaller than an amount of impurities added to the drain region DR and the source region SR are added are formed such that the LDD region LD surrounds a periphery of the drain region DR and the LDD region surrounds a periphery of the source region SR.

Here, the impurities such as phosphorus which are implanted into the semiconductor film S for forming the drain region DR and the like are field-accelerated by ionization and are implanted into an object to be worked by an ion-implantation device uniformly in plane in the direction substantially perpendicular to the substrate. An implantation depth of the ionized impurities in the substrate is controlled in accordance with energy which is imparted to the impurities at the time of field acceleration.

In this embodiment, the implantation of impurities is performed while controlling energy for the field acceleration such that the impurities are implanted into portions of the semiconductor film S positioned below the contact holes and the impurities are not implanted into portions of the semiconductor film S where the contact holes are not formed. In this manner, the drain region DR and the like are formed in a self aligning manner in accordance with the contact holes for forming the drain electrode DT and the source electrode ST.

Here, the semiconductor film S and the drain electrode DT and the like are connected to each other at transparent-substrate-GA-side opening portions of the contact holes which are formed in the insulation film GI2. In the opening portions, the insulation film GI2 and the insulation film GI3 which become barriers which prevent the impurities implanted by the ion-implantation device from reaching the semiconductor film S are not present. Accordingly, the drain region DR and the like are formed in a self aligning manner in regions of the semiconductor film S in the vicinity of the opening portions of the contact holes (hereinafter, referred to as connection regions).

Here, the impurities reach regions of the semiconductor film S present around the connection regions (hereinafter, referred to as peripheral regions) by way of the insulation film GI2 which forms a brim of the contact hole or the like and hence, the density of impurities implanted into the peripheral regions is lower than the density of impurities implanted into the connection region. In this manner, in accordance with the insulation film which form the brims of the contact holes, the LDD regions LD are formed around the connection regions in a self aligning manner. When the contact hole has a circular cross section, the LDD region LD also has a circular shape, while when the contact hole has a rectangular cross section, the LDD region LD also has a rectangular shape.

Heretofore, the constitution of the thin film transistor TFT formed on the TFT substrate SUB of this embodiment has been explained. Hereinafter, a manufacturing method of such a thin film transistor TFT is explained in conjunction with FIG. 4A to FIG. 4I.

Figure 4A:
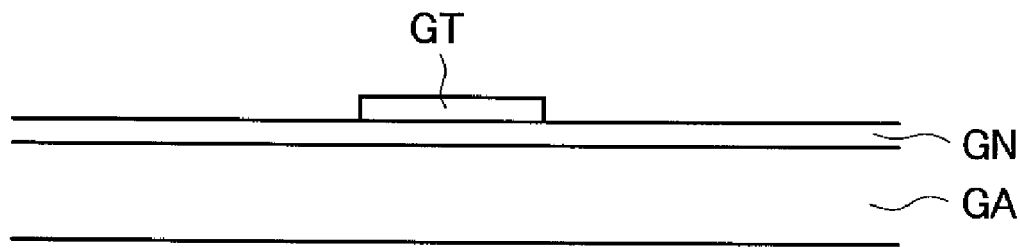
FIG. 4A is a view showing a mode in which the thin film transistor of the display device according to the embodiment is manufactured.
Figure 4B:
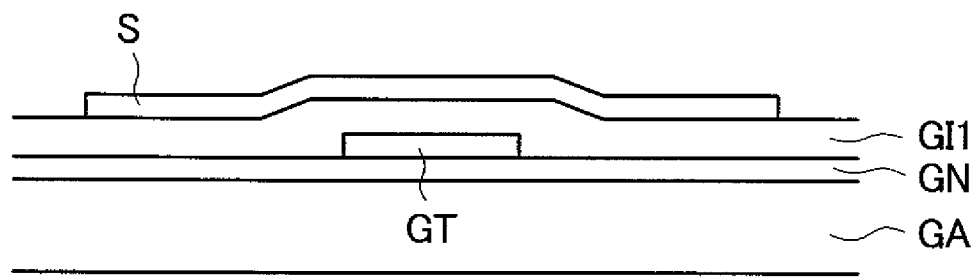
FIG. 4B is a view showing a mode in which the thin film transistor of the display device according to the embodiment is manufactured.

First of all, the contamination preventing film GN and the gate electrode GT are sequentially stacked on the transparent substrate GA (FIG. 4A). The transparent substrate GA is formed of a glass substrate, for example. The contamination preventing film GN made of silicon nitride (SiN) is formed using a CVD method, for example. Further, the gate electrode GT made of a conductive metal such as molybdenum is formed into a shape shown in the drawing through a known lithography step and a known etching step. Next, the gate insulation film GI1 is formed so as to cover the gate electrode GT, and the semiconductor film S is formed on the gate insulation film GI1 (FIG. 4B). The gate insulation film GI1 is made of, for example, silicon dioxide ($SiO_2$) and is formed using a CVD method or the like. In forming the semiconductor film S, first of all, an amorphous silicon film is formed using a CVD method and, thereafter, amorphous silicon is crystallized to polycrystalline silicon by laser annealing. The semiconductor film S made of polycrystalline silicon by crystallization is formed into a shape shown in the drawing through a known lithography step and a known etching step.

Figure 4C:
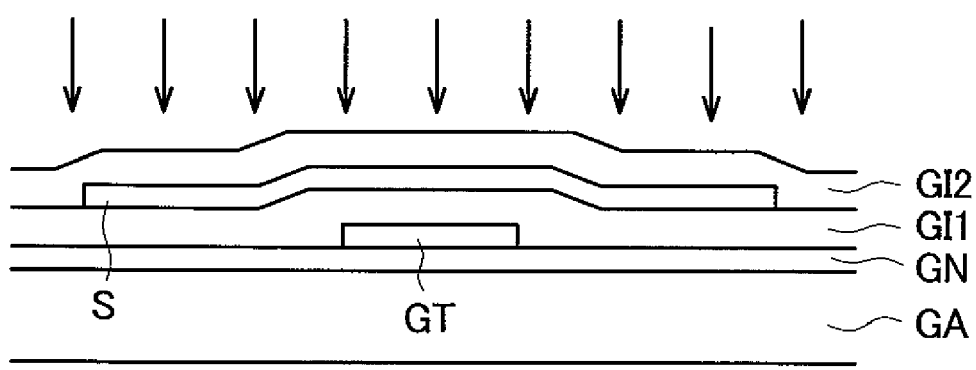
FIG. 4C is a view showing a mode in which the thin film transistor of the display device according to the embodiment is manufactured.
Figure 4D:
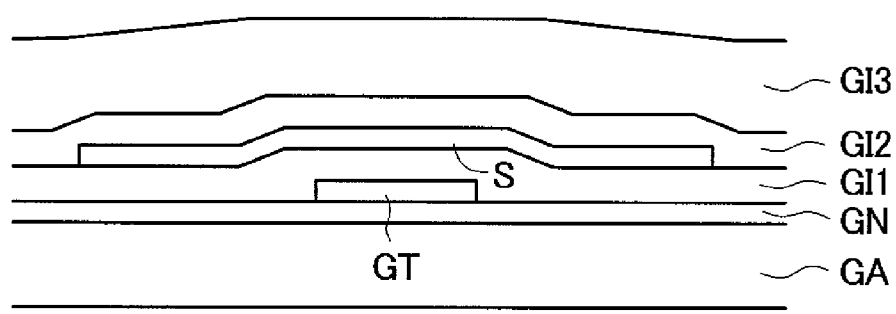
FIG. 4D is a view showing a mode in which the thin film transistor of the display device according to the embodiment is manufactured.

Next, the insulation film GI2 is formed so as to cover the semiconductor film S, and impurities are implanted into the semiconductor film S for controlling electric characteristics of the thin film transistor TFT (FIG. 4C). Thereafter, the insulation film GI3 is further formed on the insulation film GI2 (FIG. 4D). Here, the insulation film GI2 and the insulation film GI3 are respectively made of silicon dioxide and are formed using a CVD method, for example.

Figure 4E:
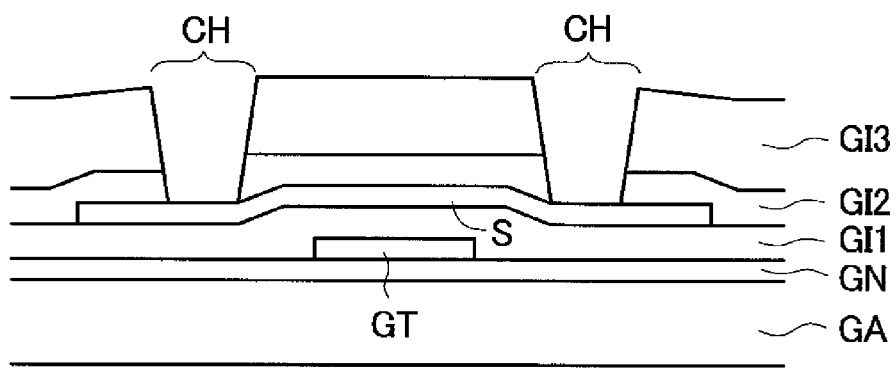
FIG. 4E is a view showing a mode in which the thin film transistor of the display device according to the embodiment is manufactured.

Here, the contact holes CH are formed in the insulation film GI3 and the insulation film GI2 by way of a known lithography step and a known etching step (FIG. 4E). The contact holes CH are formed for connecting the drain electrode DT and the source electrode ST which are formed in a step described later to the semiconductor film S.

Here, the known lithography step is explained. First of all, photoresist is applied to the above-mentioned insulation film GI3 by coating, and ultraviolet rays or the like are radiated to the photoresist by way of a photo mask having a predetermined pattern. When a pattern which corresponds to the pattern of the photo mask is transferred to the photoresist, portions to which ultraviolet rays or the like are radiated and portions to which ultraviolet rays or the like are not radiated are formed, and a chemical reaction takes place in the ultraviolet-rays-radiated portions of the photoresist. Then, portions of the photoresist where the chemical reaction takes place or portions of the photoresist where the chemical reaction does not take place are removed by a development process so that a resist pattern is formed.

In FIG. 4E, ultraviolet rays or the like are radiated to the insulation film GI3 to which the photoresist is applied by coating by way of a predetermined photo mask having a pattern corresponding to the contact holes CH and, thereafter, a development process is performed thus forming a resist pattern on the insulation film GI3 at portions except for the contact holes CH. Then, the contact holes CH are formed in the insulation film GI3 and the insulation film GI2 through an etching step such as dry etching or wet etching using the formed resist pattern as a mask. The contact holes CH are formed in various shapes depending on a forming method or a forming condition in the etching step, and etching is stopped at the semiconductor film S. Particularly, the shape of the formed contact hole CH in this embodiment is formed such that a size of the contact hole CH is decreased corresponding to the increase of a depth of the contact hole CH. For example, the contact hole CH is formed by wet etching, and a size of the contact hole CH is gradually decreased along with the gradual increase of the depth of the contact hole CH due to a tapered surface inclined at a predetermined angle.

Figure 4F:
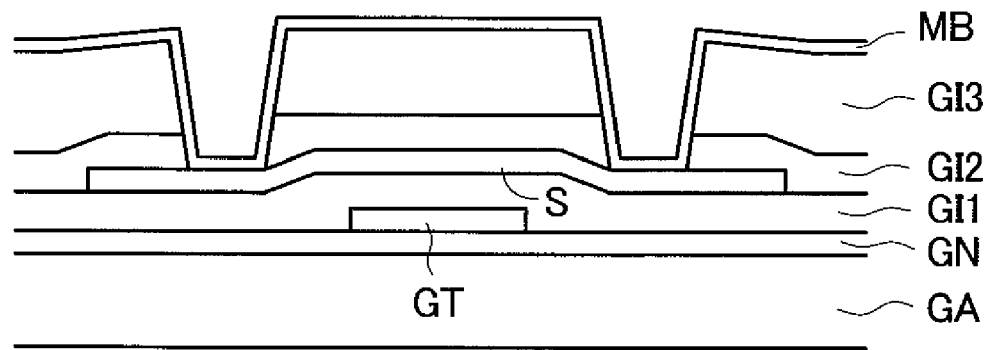
FIG. 4F is a view showing a mode in which the thin film transistor of the display device according to the embodiment is manufactured.

Next, a barrier metal layer MB which protects the drain electrodes DT and the like is formed on the insulation film GI3 and the like in which the contact holes CH are formed. The barrier metal layer MB is formed of a conductive metal thin film made of high-melting-point metal such as titanium, tungsten, chromium or molybdenum, for example, using a sputtering method (FIG. 4F). As shown in FIG. 4F, the barrier metal layer MB is formed on the insulation film GI3, the insulation film GI2 and portions of the semiconductor films S which are exposed due to the formation of the contact holes CH.

Figure 4G:
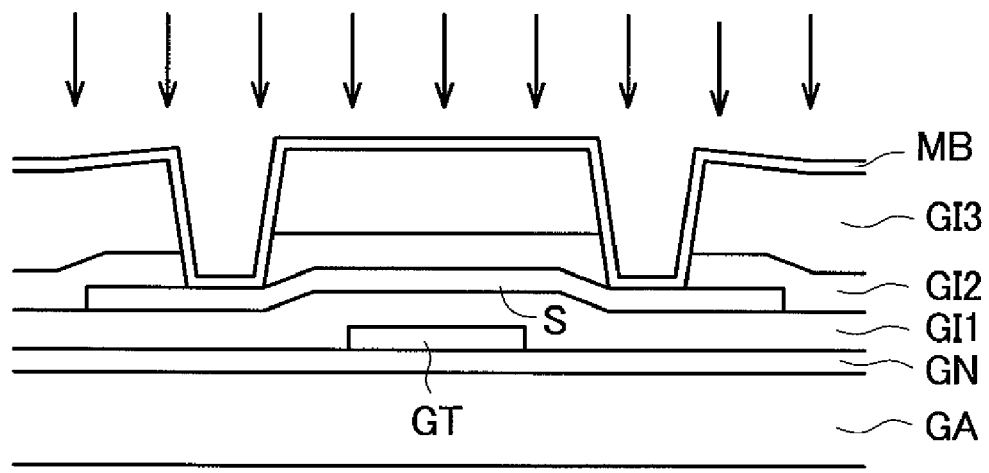
FIG. 4G is a view showing a mode in which the thin film transistor of the display device according to the embodiment is manufactured.

In this embodiment, particularly, ionized impurities are implanted into the semiconductor film S by way of the barrier metal layer MB (FIG. 4G). Here, the implanted impurities are, for example, N-type impurities such as phosphorous. The impurities are field-accelerated by ionizing the impurities using the ion-implantation device, and are implanted into the barrier metal layer MB which is formed as described above in the direction substantially perpendicular to the barrier metal layer MB. The ionized impurities are electrically neutralized on the barrier metal layer MB and the electrification of the semiconductor film S is suppressed and hence, it is possible to make the potential difference generated between the semiconductor film S and the gate electrode GT small. Accordingly, it is possible to prevent electrostatic breakdown of the gate insulation film GI1 which may occur when the semiconductor film S is doped with the impurities.

Figure 4H:
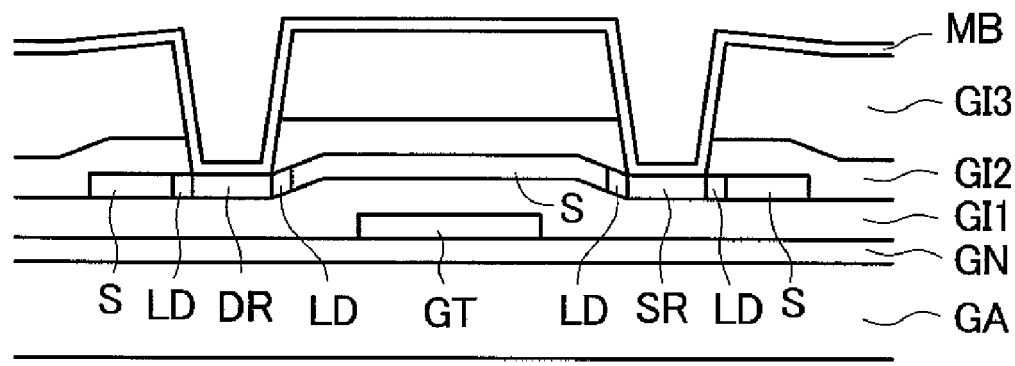
FIG. 4H is a view showing a mode in which the thin film transistor of the display device according to the embodiment is manufactured.
Figure 5:
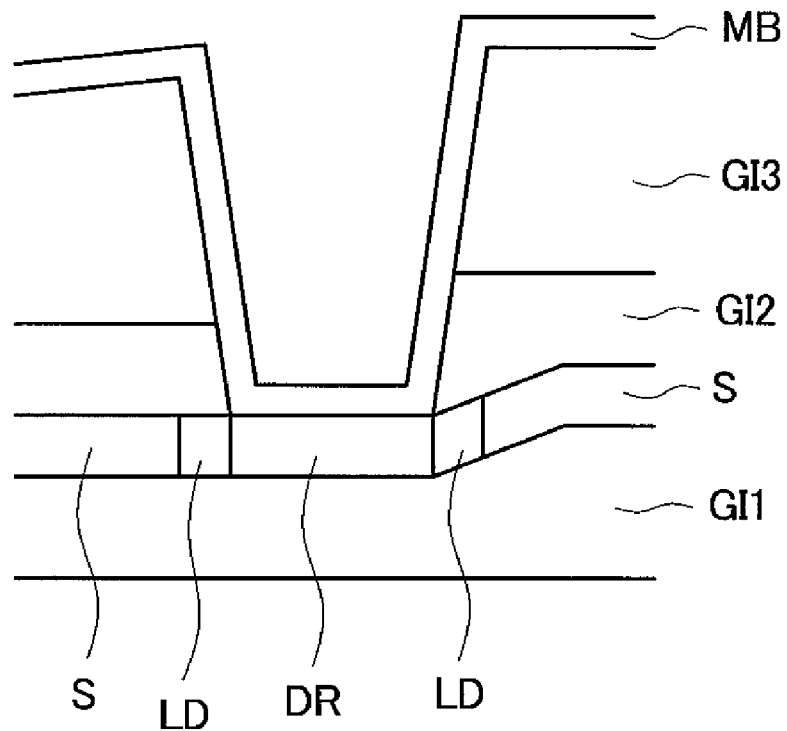
FIG. 5 is a view showing a state in which impurities are implanted into a semiconductor film in FIG. 4H.
Figure 6A:
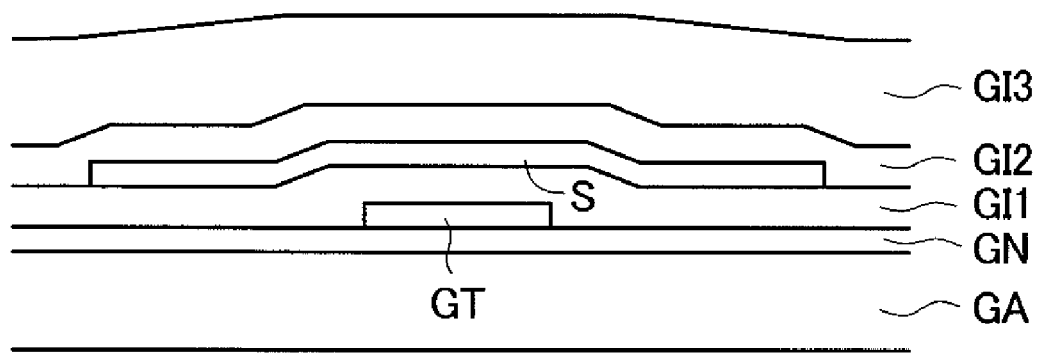
FIG. 6A is a view showing a mode in which a thin film transistor of a conventional display device is manufactured.
Figure 6B:
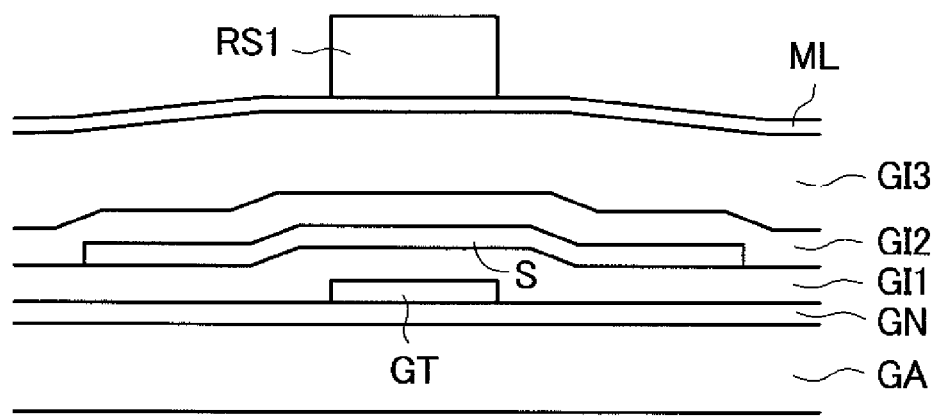
FIG. 6B is a view showing a mode in which the thin film transistor of the conventional display device is manufactured.
Figure 6C:
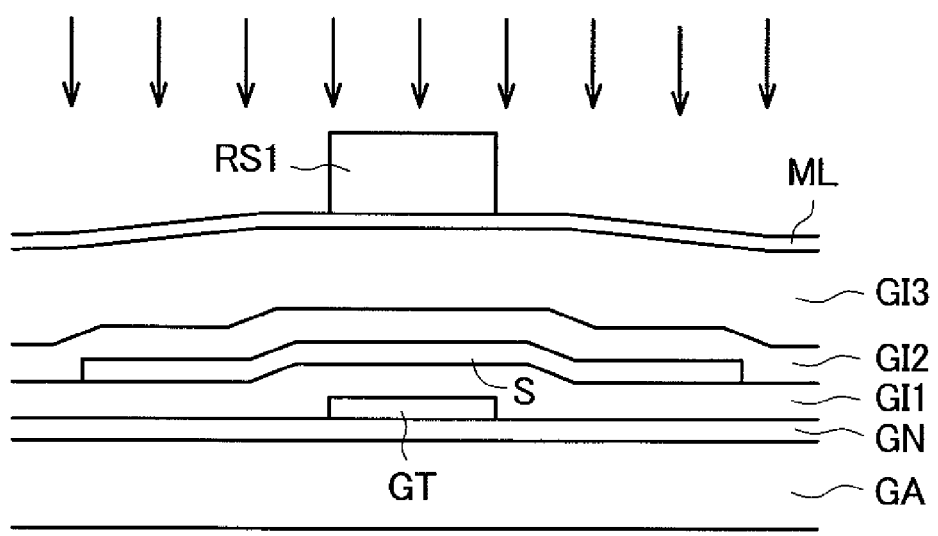
FIG. 6C is a view showing a mode in which the thin film transistor of the conventional display device is manufactured.
Figure 6D:
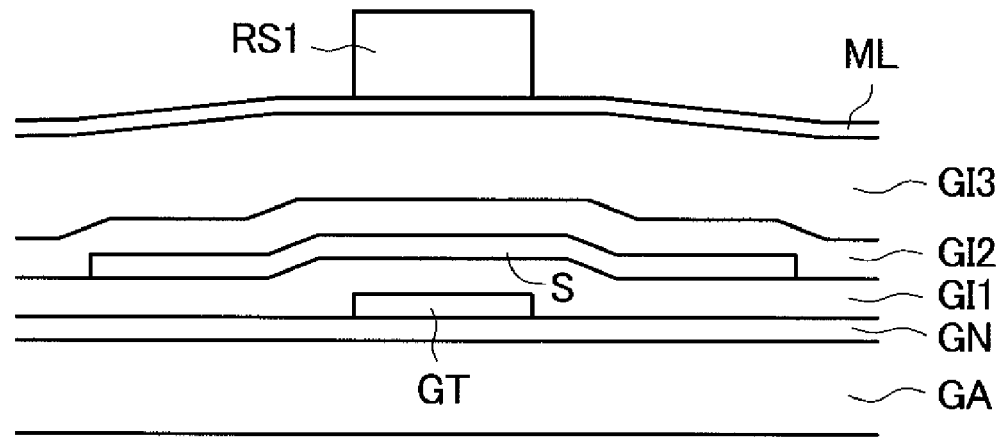
FIG. 6D is a view showing a mode in which the thin film transistor of the conventional display device is manufactured.
Figure 6E:
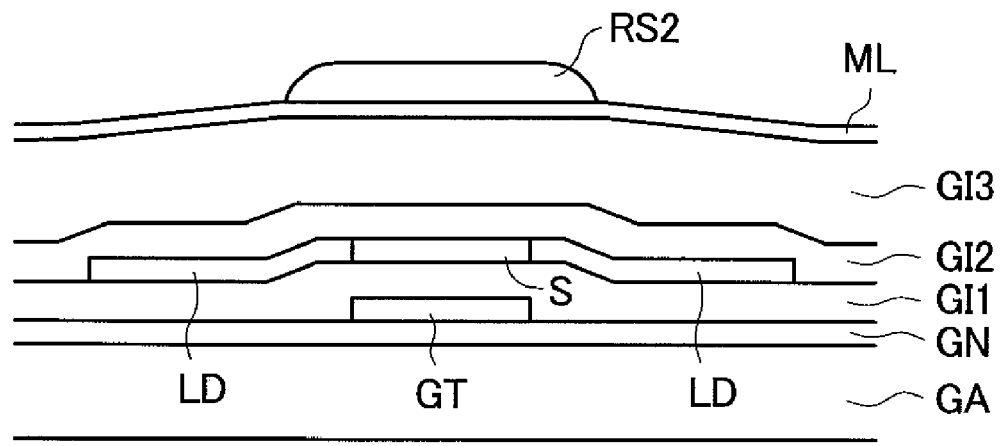
FIG. 6E is a view showing a mode in which the thin film transistor of the conventional display device is manufactured.
Figure 6F:
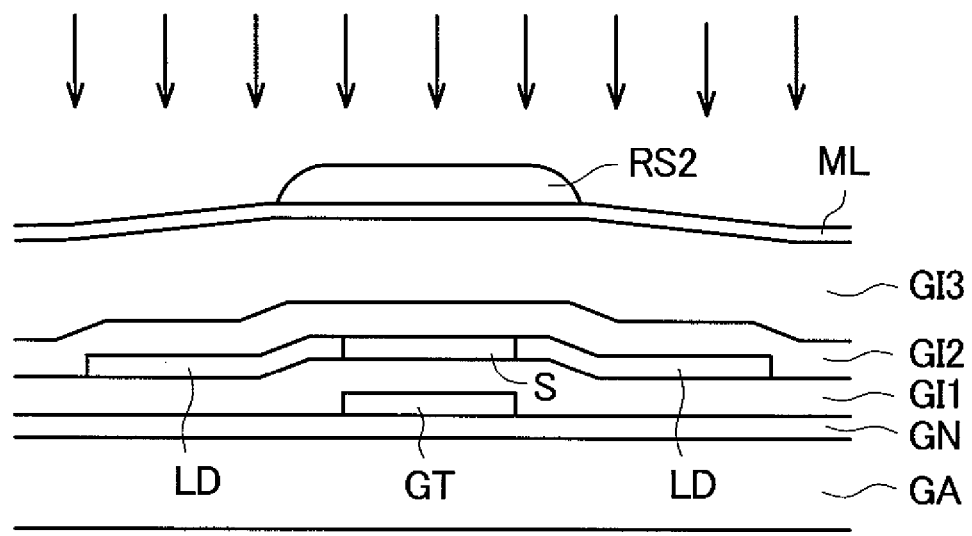
FIG. 6F is a view showing a mode in which the thin film transistor of the conventional display device is manufactured.
Figure 6G:
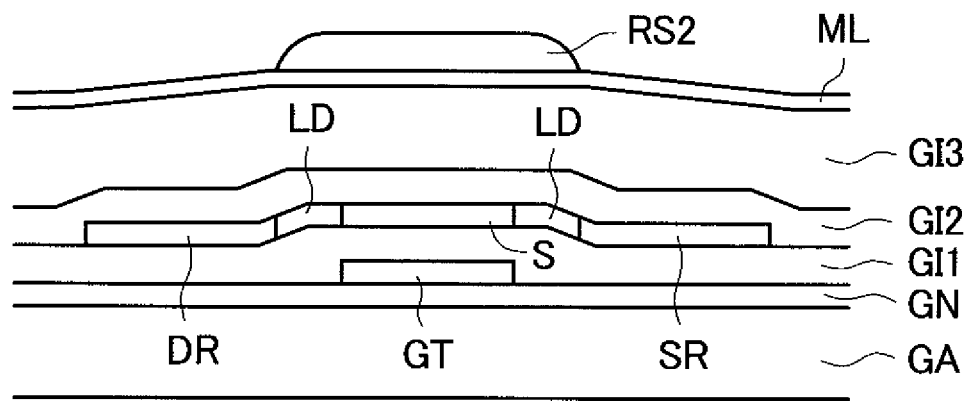
FIG. 6G is a view showing a mode in which the thin film transistor of the conventional display device is manufactured.
Figure 6H:
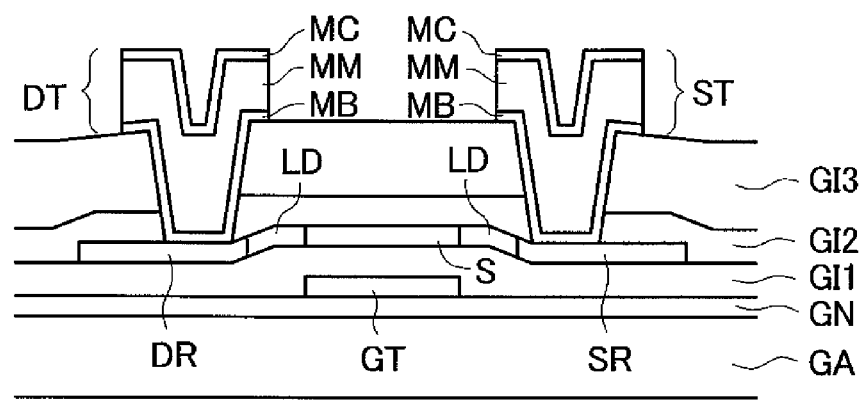
FIG. 6H is a view showing a mode in which the thin film transistor of the conventional display device is manufactured.

Here, an implantation depth of the ionized impurities is controlled in accordance with energy which is imparted to the impurities at the time of field acceleration. FIG. 4H is a view showing a mode in which the impurities are implanted into the semiconductor film S while controlling the energy so as to implant the impurities approximately to a depth which corresponds to a total thickness obtained by adding a thickness of the barrier metal layer MB and a thickness of the semiconductor film S, and FIG. 5 is an enlarged view of a portion in FIG. 4H showing a state in which the impurities are implanted into the semiconductor film S.

As described above, the contact hole CH is formed such that the size of the contact hole CH is decreased corresponding to the increase of the depth of the contact hole CH and hence, the total thickness of the insulation film GI2 and the insulation film GI3 which are interposed between the barrier metal layer MB and the semiconductor film S is increased along with the increase of a distance from a semiconductor-film-S-side opening portion which corresponds to a bottom portion of the contact hole CH. Further, along with the increase of the total thickness of the insulation films interposed between the barrier metal layer MB and the semiconductor film S, an amount of impurities which can reach at the semiconductor film S is decreased. In this manner, an approximately fixed amount of impurities is implanted into the connection regions of the semiconductor film S which are connected to the drain electrode DT and the source electrode ST arranged in the vicinity of the opening portions at respective positions of the connection regions so that the drain region DR and the source region SR are formed in a self aligning manner. Further, at respective positions in the peripheral regions around the connection regions, impurities whose amount is smaller than an amount of impurities implanted into the drain region DR and the source region SR are implanted into the semiconductor film S and hence, the LDD regions LD are formed in a self aligning manner.

At respective positions of the peripheral regions, the ion implantation device implants the impurities into the semiconductor film in the direction substantially perpendicular to the transparent substrate GA and hence, the larger the distance between the position and the contact hole in the direction perpendicular to the transparent substrate GA, the smaller an amount of impurities to be implanted becomes.

In such a case, when the contact hole CH has a tapered shape which is inclined at a predetermined angle, the amount of impurities implanted into the semiconductor film S at respective positions of the peripheral region is decreased corresponding to the increase of the distance from the center of the contact hole CH. Due to the inclination of the tapered shape, an amount of impurities implanted into the semiconductor film S at respective positions of the peripheral region is decreased at a fixed ratio corresponding to the increase of the distance from the connection region and hence, the LDD regions LD having a density gradient of impurities are formed in a self aligning manner. In this case, the density of impurities is continuously changed from the drain region DR and the source region SR to the LDD regions LD.

Figure 4I:
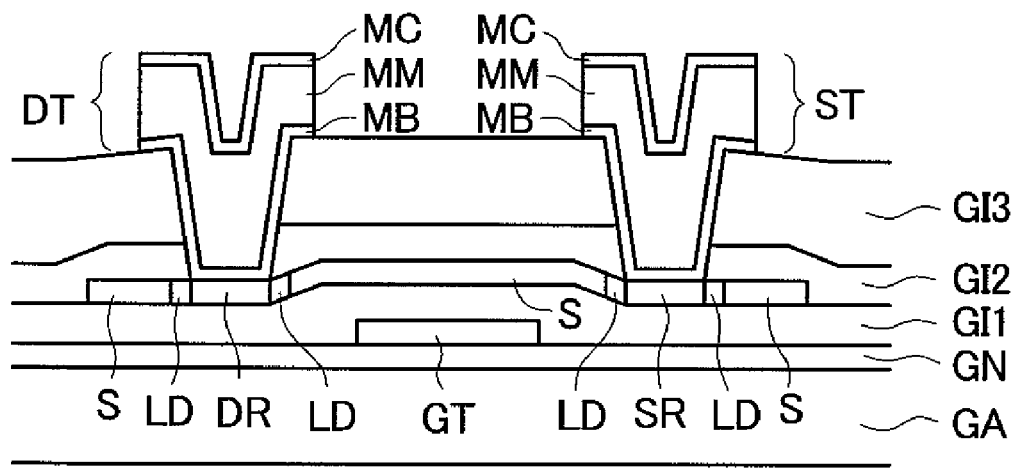
FIG. 4I is a view showing a mode in which the thin film transistor of the display device according to the embodiment is manufactured.

After implanting the impurities into the semiconductor film S, a main line layer MM and a cap metal layer MC are formed on the barrier metal layer MB, and the drain electrodes DT and the source electrodes ST are formed (FIG. 4I). The main line layer MM is made of aluminum or an aluminum alloy, and the cap metal layer MC is formed of a metal thin film made of high-melting-point metal such as titanium, tungsten, chromium or molybdenum, for example. Both the main line layer MM and the cap metal layer MC are formed by a sputtering method. Further, the barrier metal layer MB, the main line layer MM and the cap metal layer MC are respectively formed into shapes as shown in FIG. 4I through a known lithography step and a known etching step thus forming the drain electrodes DT and the source electrodes ST. Thereafter, a passivation film made of silicon nitride is formed so as to cover the drain electrodes DT, the source electrodes ST and the insulation film GI3.

In the above-mentioned embodiment, the explanation has been made with respect to the manufacturing method which manufactures the thin film transistor TFT on the TFT substrate SUB. However, the invention is not limited to the above-mentioned embodiment.

In the above-mentioned embodiment, the contact hole CH which is formed in the insulation film GI2 and the insulation film GI3 is formed by wet etching so as to have the tapered shape inclined at a predetermined angle. However, the contact hole CH may be formed by a process other than the above-mentioned process. For example, the contact hole CH may be formed such that a size of the contact hole CH is decreased in a stepwise manner, a taper angle of the contact hole CH is changed corresponding to a depth of the contact hole CH, or a portion of the contact hole CH has a tapered shape. Here, a shape of the contact hole CH and thicknesses of the insulation film GI2 and the insulation film GI3 are designed so as to impart desired characteristics to the thin film transistor TFT formed on the display device. Areas of the drain region DR and the source region SR, densities of impurities in the drain region DR and the source region SR, areas of the LDD regions LD and the densities of impurities in the LDD regions LD and the like are also designed so as to impart desired characteristics to the thin film transistor TFT. Accordingly, when energy is imparted to the ionized impurities, the ionized impurities are implanted into the semiconductor film S corresponding to a formed shape of the contact hole CH and the like.

Further, in the above-mentioned embodiment, the ionized impurities are implanted into the semiconductor film S by way of the barrier metal layer MB. However, for example, the impurities may be implanted into the semiconductor film S by way of the barrier metal layer MB and the main line layer MM after forming the main line layer MM or the impurities may be implanted into the semiconductor film S by way of a metal thin film or a metal film which constitutes at least a portion of the drain electrode DT and the source electrode ST. In such a case, it is possible to prevent the electrostatic breakdown of the semiconductor film S when the semiconductor film S is doped with the impurities.

Figure 7:
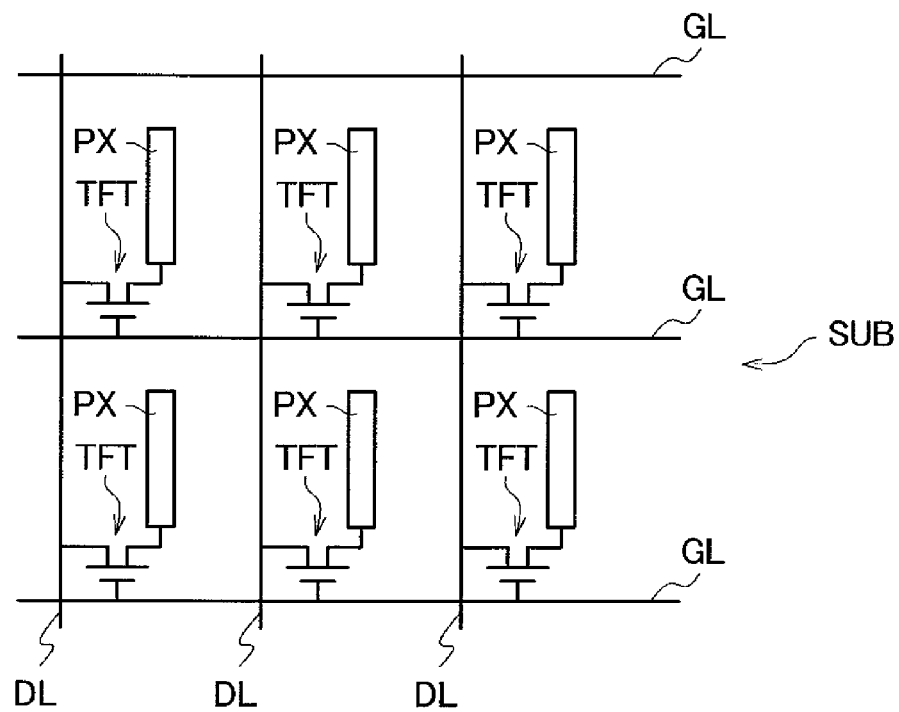
FIG. 7 is a view showing one example of an equivalent circuit of a TFT substrate which constitutes a VA-type or a TN-type display device.
Figure 8:
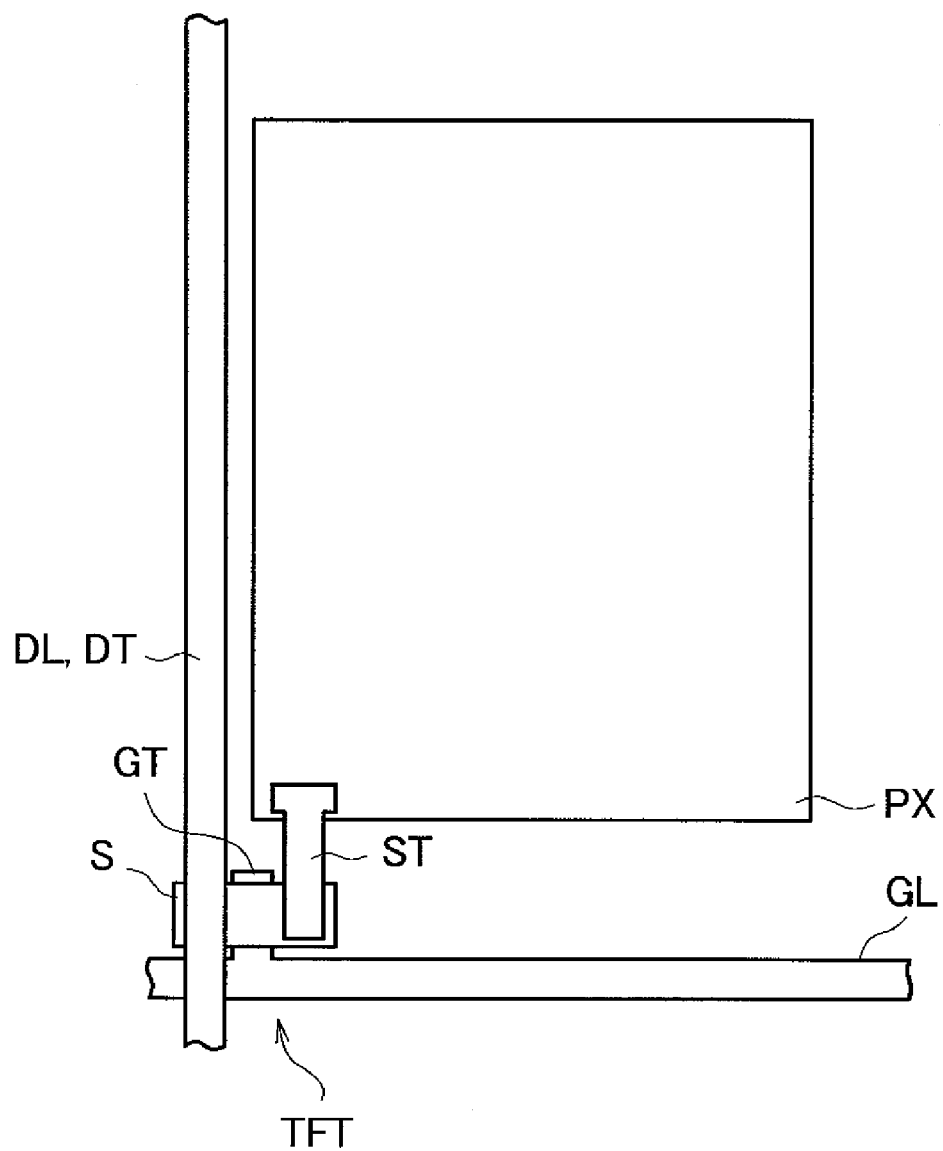
FIG. 8 is an enlarged plan view showing one example of a pixel region of a VA-type or a TN-type TFT substrate.

Here, in the liquid crystal display device according to the embodiment of the invention which has been explained heretofore, the IPS method is adopted as the drive method of liquid crystal. However, the invention is also applicable to a liquid crystal display device which adopts other drive methods such as a VA (Vertically Aligned) method or a TN (Twisted Nematic) method, for example. FIG. 7 is a view showing an equivalent circuit of a TFT substrate SUB of a display device which adopts a VA method or a TN method, and FIG. 8 is an enlarged plan view showing a pixel region of the TFT substrate SUB of the display device which adopts the VA method or the TN method. When the display device adopts the VA method or the TN method, instead of mounting counter electrodes CT and the common signal lines CL on a TFT substrate SUB, the counter electrodes CT are formed on a counter substrate which faces the TFT substrate in an opposed manner and forms color filters thereon.

Here, in the above-mentioned embodiment of the invention, the display device is explained by taking the liquid crystal display device as an example. However, it is needless to say that the invention is not limited to the above-mentioned liquid crystal display device and is applicable also to other display devices such as a display device which adopts organic EL (Electro Luminescence) elements, for example.

What is claimed is:

1. A display device comprising:
    a transparent substrate;
    gate electrodes which are stacked on the transparent substrate;
    semiconductor films which are stacked above the gate electrodes and constitute thin film transistors together with the gate electrodes;
    source electrodes and drain electrodes which are formed above the semiconductor films;
    an insulation film which is stacked between the source electrodes and the semiconductor films and between the drain electrodes and the semiconductor films; and
    contact holes which are formed in the insulation film so as to connect the source electrodes and the drain electrodes with the semiconductor films, wherein:
    each of the semiconductor films includes a connection region which is positioned at least below the contact hole and is connected with one of the source electrodes, and a connection region which is positioned at least below one of the contact holes and is connected with one of the drain electrodes, and impurities are implanted into the connection regions,
    wherein the impurities are implanted into each of the semiconductor films such that density of impurities in a peripheral region around the connection region is lower than density of the impurities in the connection region, and
    wherein a size of each of the contact holes is made smaller corresponding to the increase of a depth of the contact hole, and an amount of impurities implanted into each of the semiconductor films at each position of the peripheral region is decreased corresponding to the increase of distance in the direction perpendicular to the transparent substrate from the position of the peripheral region to the contact hole.

2. A display device according to claim 1, wherein each of the contact holes has a tapered shape which is inclined at a predetermined angle, and the amount of impurities implanted into the semiconductor film at each position of the peripheral region is decreased corresponding to the increase of distance from the center of the contact hole.

3. A display device according to claim 1, wherein each of the source electrodes and the drain electrodes are respectively formed of a plurality of metal films including a conductive metal thin film which is formed on a portion of the source electrode and the drain electrode, and
    the conductive metal thin film is in contact with the insulation film and the contact hole so as to protect the source electrode and the drain electrode.

* * * * *